United States Patent [19]

Imamura

[11] Patent Number: 5,225,774
[45] Date of Patent: Jul. 6, 1993

[54] SEMICONDUCTOR INTEGRATED CIRCUIT

[75] Inventor: Hirohisa Imamura, Tokyo, Japan

[73] Assignee: NEC Corporation, Tokyo, Japan

[21] Appl. No.: 731,754

[22] Filed: Jul. 16, 1991

[30] Foreign Application Priority Data

Jul. 16, 1990 [JP] Japan .................. 2-187755

[51] Int. Cl.⁵ ................................. G01R 31/28
[52] U.S. Cl. .................. 324/158 R; 371/22.5
[58] Field of Search ............ 329/73.1, 15 R; 371/22.3, 25.1, 22.5, 22.6

[56] References Cited

U.S. PATENT DOCUMENTS

| | | | |
|---|---|---|---|
| 4,357,703 | 11/1982 | Van Brunt | 371/22.5 |
| 4,527,115 | 7/1985 | Mikota et al. | 324/73.1 |
| 4,698,588 | 10/1987 | Hwang et al. | 371/22.3 |
| 4,780,666 | 10/1988 | Sakashita et al. | 324/73.1 |
| 4,782,283 | 11/1988 | Zasio . | |
| 4,864,165 | 9/1989 | Hoberman et al. | 324/73.1 |
| 4,864,579 | 9/1989 | Kishida et al. | 371/25.1 |
| 4,870,345 | 9/1989 | Tomnoka et al. | 371/25.1 |
| 4,912,395 | 3/1990 | Sato et al. | 371/25.1 |
| 4,931,722 | 6/1990 | Stoica | 371/22.5 |
| 5,012,185 | 4/1991 | Ohfuji | 371/22.6 |

Primary Examiner—Ernest F. Karlsen

[57] ABSTRACT

A semiconductor integrated circuit includes transfer gates to separate a plurality of functional devices and an input or output buffer circuit, and a test circuit to connect the input buffer circuit and the output buffer circuit directly, when input, output, and input and output characteristics of the input buffer circuit and the output buffer circuit are tested. Therefore, only one test pattern is used, so that the characteristics of the buffer circuits are tested easily in a short time and exactly.

7 Claims, 7 Drawing Sheets

FIG. 3

| NO. | TEST TERMINAL | INPUT TERMINAL | | | | | | | OUTPUT TERMINAL | | | | | | |
|---|---|---|---|---|---|---|---|---|---|---|---|---|---|---|---|
| | 116 | 108 | 109 | 110 | 111 | 112 | 113 | 117 | 118 | 119 | 120 | 121 | 122 |
| 1 | 1 | 0 | 0 | 0 | 0 | 0 | 0 | 1 | 1 | 1 | 1 | 1 | 1 |
| 2 | 1 | 1 | 1 | 1 | 1 | 1 | 1 | 0 | 0 | 0 | 0 | 0 | 0 |

FIG.5

| NO. | TEST TERMINAL | | INPUT TERMINAL | | | | | | OUTPUT TERMINAL | | | | | | |
|---|---|---|---|---|---|---|---|---|---|---|---|---|---|---|---|
| | 214 | 215 | 208 | 209 | 210 | 211 | 212 | 213 | 211 | 212 | 213 | 218 | 219 | 220 | 221 |
| 1 | 1 | 0 | 0 | 0 | 0 | 0 | 0 | 0 | ✕ | ✕ | ✕ | 0 | 0 | 0 | 0 |
| 2 | 1 | 0 | 0 | 0 | 1 | 0 | 0 | 1 | ✕ | ✕ | ✕ | 0 | 0 | 1 | 0 |
| 3 | 1 | 0 | 0 | 1 | 0 | 0 | 1 | 0 | ✕ | ✕ | ✕ | 0 | 1 | 0 | 0 |
| 4 | 1 | 0 | 0 | 1 | 1 | 0 | 1 | 1 | ✕ | ✕ | ✕ | 1 | 1 | 1 | 0 |
| 5 | 1 | 0 | 1 | 0 | 0 | 1 | 0 | 0 | ✕ | ✕ | ✕ | 1 | 0 | 0 | 0 |
| 6 | 1 | 0 | 1 | 0 | 1 | 1 | 0 | 1 | ✕ | ✕ | ✕ | 1 | 1 | 1 | 1 |
| 7 | 1 | 0 | 1 | 1 | 0 | 1 | 1 | 0 | ✕ | ✕ | ✕ | 1 | 1 | 0 | 1 |
| 8 | 1 | 0 | 1 | 1 | 1 | 1 | 1 | 1 | 0 | 0 | 0 | 0 | 0 | 0 | 1 |
| 9 | 1 | 1 | 0 | 0 | 0 | 0 | 0 | 1 | 0 | 0 | 1 | 0 | 0 | 0 | 0 |
| 10 | 1 | 1 | 0 | 1 | 1 | 0 | 1 | 0 | 0 | 1 | 0 | 0 | 0 | 0 | 0 |
| 11 | 1 | 1 | 0 | 1 | 0 | 1 | 0 | 0 | 1 | 0 | 0 | 0 | 0 | 0 | 0 |
| 12 | 1 | 1 | 1 | 0 | 1 | 0 | 1 | 0 | 0 | 0 | 0 | 0 | 0 | 0 | 0 |
| 13 | 1 | 1 | 1 | 0 | 0 | 0 | 0 | 0 | 0 | 1 | 0 | 0 | 0 | 0 | 0 |
| 14 | 1 | 1 | 1 | 1 | 1 | 0 | 0 | 1 | 0 | 0 | 1 | 0 | 0 | 0 | 1 |
| 15 | 1 | 1 | 1 | 0 | 0 | 0 | 0 | 0 | 0 | 0 | 0 | 0 | 0 | 0 | 0 |
| 16 | 1 | 1 | 1 | 1 | 1 | 1 | 1 | 1 | 1 | 1 | 1 | 1 | 1 | 1 | 1 |

FIG.7

| NO. | TEST TERMINAL | | INPUT TERMINAL | | | | | | | OUTPUT TERMINAL | | | | | | | |
|---|---|---|---|---|---|---|---|---|---|---|---|---|---|---|---|---|---|
| | 214 | 215 | 208 | 209 | 210 | 211 | 212 | 213 | 211 | 212 | 213 | 218 | 219 | 220 | 221 |
| 1 | 1 | 0 | ✕ | ✕ | ✕ | 0 | 0 | 0 | ✕ | ✕ | ✕ | 0 | 0 | 0 | 0 |
| 2 | 1 | 0 | ✕ | ✕ | ✕ | 0 | 0 | 1 | ✕ | ✕ | ✕ | 0 | 0 | 1 | 0 |
| 3 | 1 | 0 | ✕ | ✕ | ✕ | 0 | 1 | 0 | ✕ | ✕ | ✕ | 0 | 1 | 0 | 0 |
| 4 | 1 | 0 | ✕ | ✕ | ✕ | 0 | 1 | 1 | ✕ | ✕ | ✕ | 0 | 1 | 1 | 0 |
| 5 | 1 | 0 | ✕ | ✕ | ✕ | 1 | 0 | 0 | ✕ | ✕ | ✕ | 1 | 0 | 0 | 1 |
| 6 | 1 | 0 | ✕ | ✕ | ✕ | 1 | 0 | 1 | ✕ | ✕ | ✕ | 1 | 0 | 1 | 1 |
| 7 | 1 | 0 | ✕ | ✕ | ✕ | 1 | 1 | 0 | ✕ | ✕ | ✕ | 1 | 1 | 0 | 1 |
| 8 | 1 | 0 | ✕ | ✕ | ✕ | 1 | 1 | 1 | ✕ | ✕ | ✕ | 1 | 1 | 1 | 1 |
| 9 | 1 | 1 | 0 | 0 | 0 | 0 | 0 | 0 | 0 | 0 | 0 | 0 | 0 | 0 | 0 |
| 10 | 1 | 1 | 0 | 0 | 1 | 0 | 0 | 1 | 0 | 0 | 1 | 0 | 0 | 1 | 0 |
| 11 | 1 | 1 | 0 | 1 | 0 | 0 | 1 | 0 | 0 | 1 | 0 | 0 | 1 | 0 | 0 |
| 12 | 1 | 1 | 0 | 1 | 1 | 0 | 1 | 1 | 0 | 1 | 1 | 0 | 1 | 1 | 0 |
| 13 | 1 | 1 | 1 | 0 | 0 | 1 | 0 | 0 | 1 | 0 | 0 | 1 | 0 | 0 | 1 |
| 14 | 1 | 1 | 1 | 0 | 1 | 1 | 0 | 1 | 1 | 0 | 1 | 1 | 0 | 1 | 1 |
| 15 | 1 | 1 | 1 | 1 | 0 | 1 | 1 | 0 | 1 | 1 | 0 | 1 | 1 | 0 | 1 |
| 16 | 1 | 1 | 1 | 1 | 1 | 1 | 1 | 1 | 1 | 1 | 1 | 1 | 1 | 1 | 1 |

SEMICONDUCTOR INTEGRATED CIRCUIT

FIELD OF THE INVENTION

This invention relates to a semiconductor integrated circuit having a plurality of functional devices, and more particularly to, a semiconductor integrated circuit having an input buffer and an output buffer in which operation characteristics are tested easily in a short time.

BACKGROUND OF THE INVENTION

A conventional semiconductor integrated circuit includes a plurality of functional devices formed on a chip, an input buffer circuit including a plurality of inverters connected between input terminals and the functional devices, and an output buffer circuit including a plurality of inverters connected between output terminals and the functional devices.

In testing the conventional semiconductor integrated circuit, a predetermined pattern of voltage signal consisting of $V_{DD}$ and ground levels is applied to input terminals as high and low signals, and a pattern of voltage signals is detected at output terminals. When the detected pattern is a predetermined output pattern, it is determined that the semiconductor integrated circuit has been fabricated to have a predetermined IC pattern including transistors, interconnections, etc. If not so, it is determined to be defective.

This IC pattern test is carried out separately for each one of functional devices provided in the semiconductor integrated circuit, because the functional devices are connected through input and output buffers to corresponding ones of the input and output terminals. In this IC pattern test, interconnections of the functional devices are also checked in the same manner as described above.

After it is determined to stand the test, a predetermined pattern of voltage signals consisting of, for instance, $V_{DD} \times 0.7 (V_{IH})$ and $V_{DD} \times 0.3 (V_{IL})$ is applied to the input terminals as high and low signals. When a predetermined pattern of voltage signals is detected at the output terminals, an input characteristic of the input buffer is determined to meet the standard. Then, a predetermined pattern of voltage signals consisting of $V_{DD}$ and ground levels is applied to the input terminals to check a pattern of voltage signals at the output terminals. In this pattern detection at the output terminals, $V_{DD} \times 0.7 (V_{OH})$ and $V_{DD} \times 0.3 (V_{OL})$ are used as reference voltage for high and low levels, and output voltages are detected by measuring voltage up (increase) and decrease (drop) between a tester and each output terminal, to which the tester is connected to draw current therefrom and to supply current thereto dependent on levels of the output terminals. Thus, an output characteristic of the output buffer is examined. In addition, an input and output characteristic of the input and output buffers is examined by applying a predetermined pattern of voltage signals consisting of the $V_{IH}$ and $V_{IL}$ levels to the input terminals and detecting a pattern of voltage signal at the output terminals according to the reference voltages of the $V_{OH}$ and $V_{OL}$ levels.

As described above, the check of an IC pattern including transistors, interconnections, etc., and that of input, output, and input and output characteristics of the input and output buffers are carried out.

According to the conventional semiconductor integrated circuit, however, there is a disadvantage in that the test of the input and output buffers is complicated, because a considerable number of test patterns which are used for the test of the functional devices are utilized.

Additionally, there is a further disadvantage in that a program for the test of the input and output buffer is long and complicated, because the test continues during the conduct of a starting number of the test pattern to a predetermined number thereof, and the test such as the aforementioned $V_{OH}/V_{OL}$ check is carried out under the predetermined number of the test pattern by using the tester, so that the number of test is extraordinarily large.

SUMMARY OF THE INVENTION

Accordingly, it is an object of the invention to provide a semiconductor integrated circuit in which buffer circuits are tested easily and simply in a short time and exactly.

It is another object of the invention to provide a semiconductor integrated circuit in which buffer circuits are tested by a short and simple program.

According to the invention, a semiconductor integrated circuit comprises:

a plurality of functional devices connected to each other to carry out a predetermined operation;

an input buffer circuit connected to input terminals to supply input signals therefrom to the functional devices;

an output buffer circuit connected to output terminals to supply output signals from the functional devices to the output terminals;

first means for separating connections of the functional devices, when a characteristic test of the input and output buffer circuits is carried out;

second means for separating a connection selected from a first connection between the input buffer circuit and said functional devices and a second connection between the functional devices and the output buffer circuit, when the characteristic test is carried out; and means for connecting the input and output buffer circuits, when the second means separates the connection.

BRIEF DESCRIPTION OF THE DRAWINGS

The invention will be explained in more detail in conjunction with appended drawings; wherein:

FIG. 3 is a truth table showing test patterns used in the first preferred embodiment shown in FIG. 2;

FIG. 5 is a truth table showing test patterns used in the second preferred embodiment shown in FIG. 4;

FIG. 7 is a truth table showing test patterns used in the third preferred embodiment shown in FIG. 6;

DESCRIPTION OF THE PREFERRED EMBODIMENTS

Figure 1:
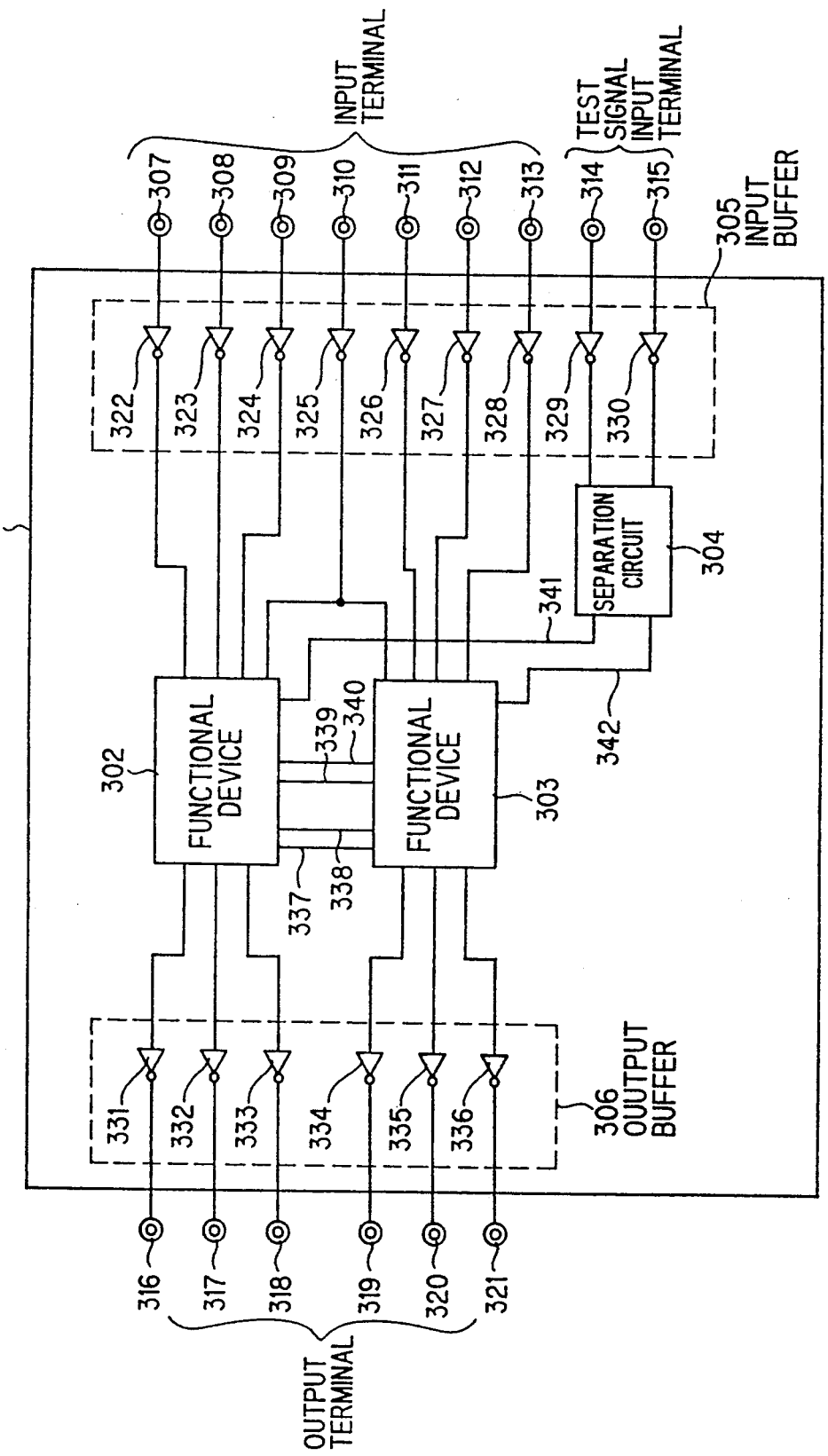
FIG. 1 is a circuit diagram showing a conventional semiconductor integrated circuit.

Before describing a semiconductor integrated circuit according to the invention, the conventional semiconductor integrated circuit described before will be explained in conjunction with FIG. 1.

The semiconductor integrated circuit 301 includes functional devices 302 and 303 having predetermined functions, respectively, a separation circuit 304 connected with the functional devices 302 and 303 by lines 341 and 342, respectively, an input buffer circuit 305 connected with input terminals 307 to 315, and an output buffer circuit 306 connected with output terminals 316 to 321.

The functional devices 302 and 303 are connected by lines 337 to 340 each other, so that predetermined signals are transferred therebetween.

The separation circuit 304 applies separation signals to the functional devices 302 and 303 to separate them in an IC pattern test, etc..

The input buffer circuit 305 includes inverters 322 to 330, among which the inverters 322 to 324 are connected between the input terminals 307 to 309 and the functional device 302, the inverters 325 is connected between the input terminal 310 and a common node of the functional devices 302 and 303, the inverters 327 to 329 are connected between the input terminals 311 to 313 and the functional device 303, and the inverters 329 and 330 are connected between the input terminals 314 and 315 and the separation circuit 304, respectively.

The output buffer circuit 306 includes inverters 331 to 336, among which the inverters 331 to 333 are connected between the functional device 302 and the output terminals 316 to 318 and the inverters 334 to 336 are connected between the functional device 303 and the output terminals 319 to 321.

In operation, an IC pattern including the functional devices 302 and 303 is tested, test signals of low ("0") level are applied to the input terminal 314 and 315, so that signals of high ("1") level are applied to the separation circuit 304 by the inverters 329 and 330. Then, the separation signals are applied to the functional devices 302 and 303, so that the devices 302 and 303 are separated. After that, the IC pattern including the functional devices 302 and 303 is checked by applying predetermined patterns of voltage signals to the input terminals 307 to 310, and 310 to 313, and detecting patterns of voltage signals at the output terminals 316 to 318, and 319 to 321, as described above.

Next, when input, output, and input and output characteristics of the input buffer circuit 305 and the output buffer circuit 306 are tested, input voltages of low ("0") and high ("1") levels consisting of $V_{DD}$ and ground levels are applied to the input terminals 307 to 310 in accordance with one of test patterns. Then, a pattern of voltage levels of the output terminals 316 to 318 are detected, thus an input characteristic of the input buffer 305 connected with the functional device 302 is tested. That is, if the pattern of the detected voltages is equal to the reference pattern, the input characteristic of the input buffer circuit 305 is determined to stand the test.

In addition, the test using applied voltage such as $V_{IH}/V_{IL}$ and reference voltages such as $V_{OH}/V_{OL}$ is carried out, as described before (not explained here).

According to the conventional semiconductor integrated circuit, the inverters 322 to 328 of the input buffer circuit 305 and the inverters 331 to 336 of the output buffer circuit 306 are not connected with both of the functional devices 302 and 303 except for the inverter 325 of the input buffer circuit 305, so that the characteristic tests of the buffer circuits 305 and 306 are required to be carried out separately in respective functional devices 302 and 303. Therefore, the disadvantages occur as described before.

Figure 2:
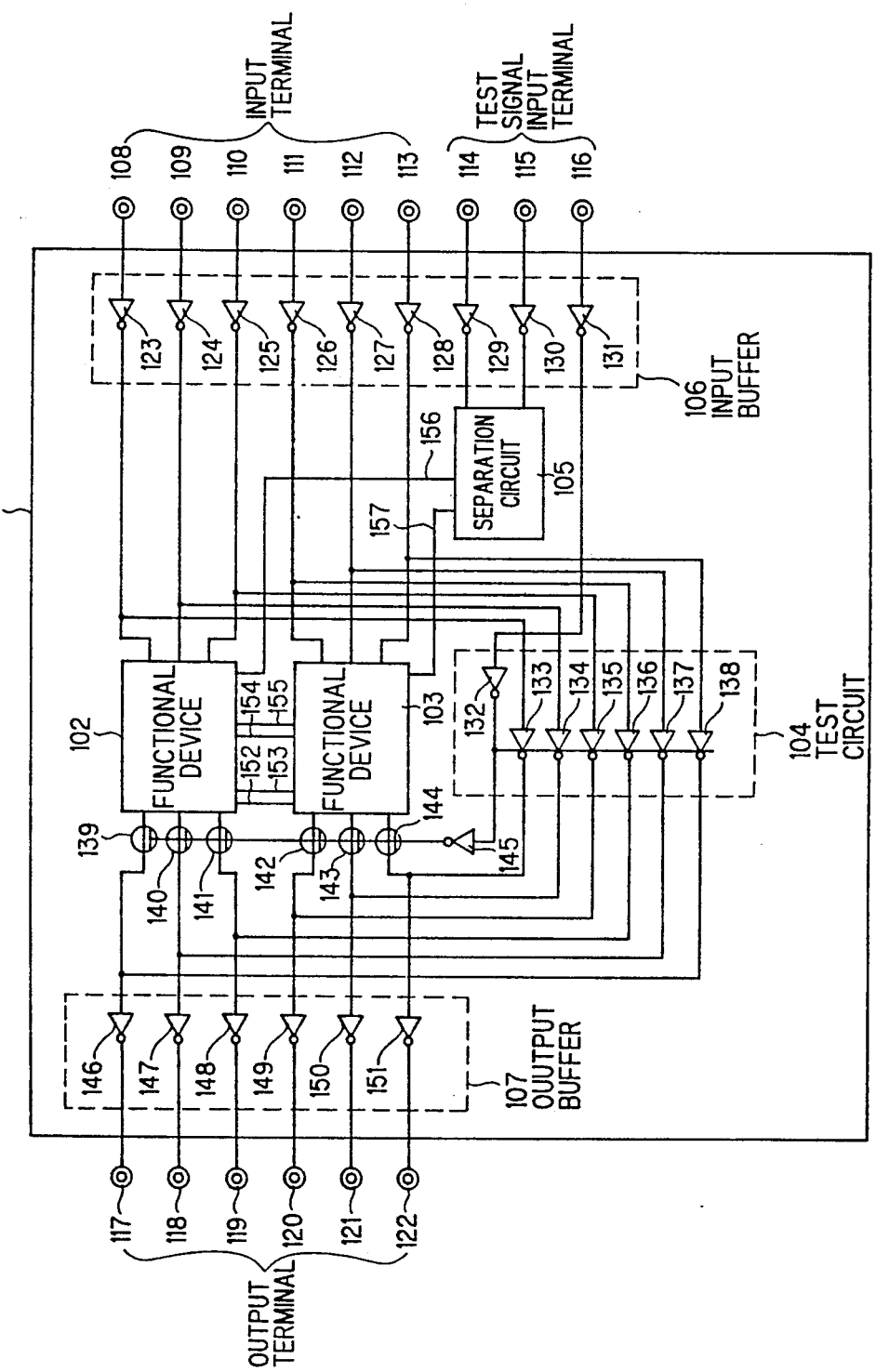
FIG. 2 is a circuit diagram showing a semiconductor circuit of a first preferred embodiment to the invention.

Next, FIG. 2 shows a semiconductor integrated circuit of a first preferred embodiment according to the invention. In this embodiment, detailed explanation of structures and operation corresponding to the conventional circuit shown in FIG. 1 is omitted. The semiconductor integrated circuit 101 includes functional devices 102 and 103, a separation circuit 105 connected with the functional devices 102 and 103 by lines 156 and 157, an input buffer circuit 106 connected with input terminals 108 to 116, an output buffer circuit 107 connected with output terminals 117 to 122, and a test circuit 104 connected between the input buffer circuit 106 and the output buffer circuit 107.

The functional devices 102 and 103 are connected by lines 152 to 155, so that predetermined signals are transferred therebetween. The separation circuit 105 applies separation signals to the functional devices 102 and 103 to separate them in an IC pattern test, etc..

The input buffer circuit 106 includes inverters 123 to 131, among which the inverters 123 to 125 are connected between the input terminals 108 to 110 and the functional device 102, the inverters 126 to 128 are connected between the input terminals 111 to 113 and the functional device 103, the inverters 129 and 130 are connected between the test signal input terminals 114 and 115 and the separation circuit 105 and inverter 131 is connected between the test signal input terminal 116 and the test circuit 104.

The output buffer circuit 107 includes inverters 146 to 151 connected at outputs to the output terminals 117 to 122 and at inputs through transfer gates 139 to 144 to the functional devices 102 and 103, respectively. The ON/OFF of the transfer gates 139 to 144 are controlled by a signal supplied via an inverter 145 from the test circuit 104.

The test circuit 104 includes an inverter 132 connected with the inverter 131 in the input buffer circuit 106 and clocked inverters 133 to 138 connected between the inverters 123 to 128 in the input buffer circuit 106 and the inverters 146 to 151 in the output buffer circuit 107, respectively. The ON/OFF of the clocked inverters 133 to 138 are controlled by the signal supplied from the inverter 132.

In operation, when the semiconductor integrated circuit 101 is normally operated, a signal of "0" level is applied to the test signal input terminal 116, so that a signal of "1" level is supplied from the inverter 131 and a signal of "0" level is supplied from the inverter 132. Then, the inverters 133 to 138 in the test circuit 104 become OFF state and the transfer gates 139 to 144 become ON state by a signal of "1" level from the inverter 145. Therefore, a signal is not applied from the test circuit 104 to the output buffer circuit 107. On the other hand, output signals are applied from the functional devices 102 and 103 to the output buffer circuit 107.

When input, output, and input and output characteristics of the input buffer circuit 106 and the output buffer circuit 107 are tested, a signal of "1" level is applied to the test signal input terminal 116, so that a signal of "1" level is supplied from the inverter 132. Then, the inverters 133 to 138 in the test circuit 104 become ON state and the transfer gates 139 to 144 become OFF state. Therefore, an output signal is not applied from the functional devices 102 and 103 to the output buffer circuit 107. On the other hand, signals supplied from the input terminals 108 to 113 are transferred through the test circuit 104 to the output terminals 117 to 122. Thus, the input terminals 108 to 113 and the output terminals 117 to 122 are connected via the input buffer circuit 106, the test circuit 104 and the output buffer circuit 107, so that the buffer circuits 106 and 107 become under test condition, respectively.

Next, signals of "1" or "0" level are applied to the input terminals 108 to 113 by the LSI tester in accordance with a test pattern shown in FIG. 3, wherein the levels "1" and "0" are set to be $V_{DD}$ and ground level for the first test, and $V_{DD} \times 0.7$ ($V_{IH}$) and $V_{DD} \times 0.3$ ($V_{IL}$) for the second test. Then, levels of the output voltage at the output terminals 117 to 122 are detected. If the voltage levels correspond to the reference pattern as shown in FIG. 3, the input buffer circuit 106 (inverters 123 to 128) is determined to stand the test.

When an output characteristic of the output buffer circuit is tested, voltage levels at the output terminals 117 to 122 are detected in the states of pattern numbers 1 and 2 (FIG. 3) by the LSI tester. In the test pattern number 1 of FIG. 3, voltage of the output terminals 117 to 122 are detected as compared to the reference voltage $V_{OH}$ ($V_{DD} \times 0.7$) by use of the LSI tester, to which current flows from the output terminals 117 to 122. Then, the test pattern number 2 of FIG. 3 is carried out, so that voltages of the output terminals 117 to 122 are detected as compared to the reference voltage $V_{OL}$ ($V_{DD} \times 0.3$) by use of the LSI tester, from which current flows to the output terminals 117 to 122.

According to the first preferred embodiment, the buffer circuits 106 and 107 are separated from the functional devices 102 and 103, and the buffer circuits 106 and 107 are directly connected by the test circuit 104, when characteristics of the buffer circuits 106 and 107 are tested. Therefore, the number of test patterns are decreased, so that characteristics of the buffer circuits 106 and 107 are tested easily in a short time and exactly.

Figure 4:
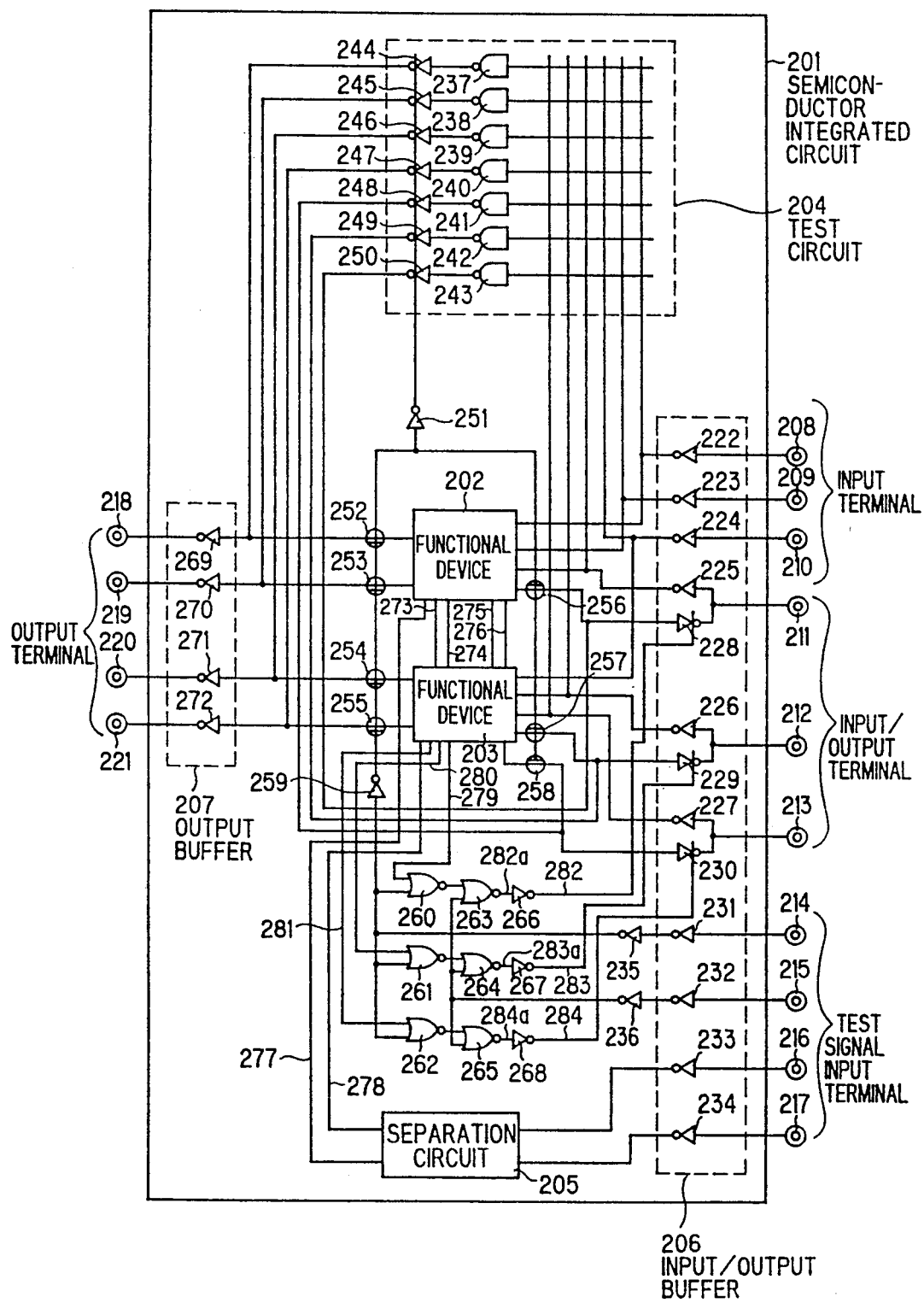
FIG. 4 is a circuit diagram showing a semiconductor integrated circuit of a second preferred embodiment according to the invention.

FIG. 4 shows a semiconductor integrated circuit of a second preferred embodiment according to the invention. In this embodiment, detailed explanation of structure and operation corresponding to the first preferred embodiment are omitted. The semiconductor integrated circuit 201 fundamentally includes functional devices 202 and 203, a separation circuit 205 connected with the functional devices 202 and 203 by lines 277 and 278, an input/output buffer circuit 206 connected with input, input/output and test signal input terminals 208 to 217, an output buffer circuit 207 connected with output terminals 218 to 221, and a test circuit 204 connected between the input/output buffer circuit 206 and the output buffer circuit 207.

The functional devices 202 and 203 are connected each other by lines 273 to 276. The separation circuit 205 applies separation signals to the functional devices 202 and 203 via the lines 277 and 278 to separate them in an IC pattern test, etc.

The input/output buffer circuit 206 includes inverters 222 to 234, among which the inverters 222 to 224 are applied with input signals from the input terminals 208 to 210, wherein the inverters 222 and 223 apply signals to the test circuit 204 and the functional device 202 and the inverter 224 applies a signal to the test circuit 204 and the functional device 203. The inverters 225 to 230 are connected with input/output terminals 211 to 213, among which the inverters 225 to 227 applies signals to the test circuit 204 and the functional device 202, and the inverters 228 to 230 of clocked inverters receive signals therefrom.

The ON/OFF of the clocked inverters 228 to 230 are controlled by signals from the test signal input terminals 214 and 215 (to be explained later). The inverter 228 is applied with signals from the test circuit 204 and the functional device 202 via a transfer gate 256, and supplies an output signal to the input/output terminal 211. The inverters 229 and 230 are applied with signals from the test circuit 204 and the functional device 203 via transfer gates 257 and 258, and supply output signals to the input/output terminals 212 and 213, respectively.

The inverters 231 to 234 are connected with the test signal input terminals 214 to 217. An input signal transferred through the inverter 231 is applied via an inverter 235 to NOR gates 260 to 262 and an inverter 259. An input signal transferred through the inverter 232 is applied via an inverter 236 to NOR gates 263 to 265. Signals supplied from the NOR gate 260 to 262 are transferred to the clocked inverters 228 to 230 via NOR gates 263 to 265 and inverters 266 to 268 to control ON/OFF of the inverters 228 to 230, respectively. Thus, input and output states of the input/output terminals 211 to 213 are changed by the changing signals 282 to 284 (outputs of the inverters 266 to 268). A signal transferred through the inverter 259 is applied to transfer gates 252 to 255, and each signal through the transfer gates 252 to 255 is applied to the test circuit 204 via an inverter 251. Test signals transferred through the inverters 233 and 234 are applied to the separation circuit 205.

The output buffer circuit 207 includes inverters 269 to 272, among which the inverters 269 to 272 are applied with signals from the test circuit 204 and the functional devices 202 and 203 via the transfer gates 252 to 255, respectively.

The test circuit 204 includes clocked inverters 244 to 250 the ON/OFF of which is controlled by a signal from the inverter 251 and NAND gates 237 to 243, and applies signals to the output terminals 218 to 221 via the output buffer circuit 207 and to the input/output terminals 211 to 213 via the clocked inverters 228 to 230 of the input/output buffer circuit 206. It is notice that each of the NAND gates 237 to 243 has two input gates, and two signals from the input/output buffer circuit 206 are applied to the gates 237 to 243 connected by intersecting points shown as black point on input lines, respectively.

In operation, when the semiconductor integrated circuit 201 is normally operated, signals of "0" level are applied to the test signal input terminals 214 and 215, so that signals of "1" level are supplied from the inverters 231 and 232, and signals of "0" level are supplied from the inverters 235 and 236. Then, the inverter 259 applies a signal of "1" level to the transfer gates 252 to 255 in response to a signal of "0" level from the inverter 235, so that the transfer gates 252 to 255 become ON state and the clocked inverters 244 to 250 become OFF state in response to a signal of "0" level from the inverter 251. Therefore, output signals supplied from the functional devices 202 and 203 are transferred to the output terminals 218 to 221 and the input/output terminals 211 to 213 via the output buffer circuit 207 and the input/output buffer circuit 206, respectively. On the other hand, no signal is supplied from the test circuit 204.

When characteristics of the input/output buffer circuit 206 and the output buffer circuit 207 are tested, a signal of "1" level is applied to the test signal input terminal 214, so that a signal of "0" level is supplied from the inverter 231, a signal of "1" level is supplied from the inverter 235. Then, the inverter 259 applies a signal of "0" level to the transfer gates 252 to 255 in response to the signal from the inverter 235, so that the transfer gates 252 to 255 become OFF state. At the same time the clocked inverters 244 to 250 become ON state in response to the signal from the inverter 251. Therefore, the input terminals 208 to 213 are connected with the output terminals 218 to 221 and 211 to 213 by a logic circuit consisting of the input/output buffer circuit 206, the test circuit 204 and the output buffer circuit 207. That is, output signals of the functional devices 202 and 203 are not transfered to the output buffer 207. On the other hand, input signals applied to the input terminals 208 to 210 and the input/output terminals 211 to 213 are transferred to the output terminals 218 to 221 and the input/output terminals 211 to 213 via the input/output buffer circuit 206, the test circuit 204 and the output buffer circuit 207.

At this time, when a signal of "0" level is applied to the test signal input terminal 215, the changing signals 283 and 284 become "1" level, so that the clocked inverters 228 to 230 become OFF state. When a signal of "1" level is applied to the test signal input terminal 215, the changing signals 283 and 284 become "0" level. Thus, the clocked inverters 228 to 230 become ON state, so that the semiconductor integrated circuit 201 becomes test condition.

In this condition, input, output, and input and output characteristics of the buffer circuits 206 and 207 are tested in the same manner as in the first preferred embodiment. That is, when input characteristic of the input/output buffer circuit 206 is tested, input signals are applied to the input terminals 208 to 213 and detecting voltage levels at the output terminals 211 to 213 in accordance with a test patterns Nos. 1 to 16 as shown in FIG. 5, wherein " " indicates the input/output terminals 211 to 213 are under an input state.

By using these test patterns, an input characteristic of the input/output buffer circuit 206 is tested in accordance with the level detection of the input terminals 208 to 210 and the input/output terminals 211 to 213.

On the other hand, the consecutive test patterns are stopped at the test pattern No. 9 to provide the input/output terminals 211 to 213 and the output terminals 218 to 221 with output signals of "0", so that the $V_{OL}$ test thereof is carried out in accordance with current flowing thereinto from an LSI tester. Otherwise, the consecutive test patterns are stopped at the test pattern No. 16 to provide the input/output terminals 211 to 213 and the output terminals 218 to 221 with output signals of "1", so that the $V_{OH}$ test thereof is carried out in accordance with current flowing therefrom to the LSI tester.

Figure 6:
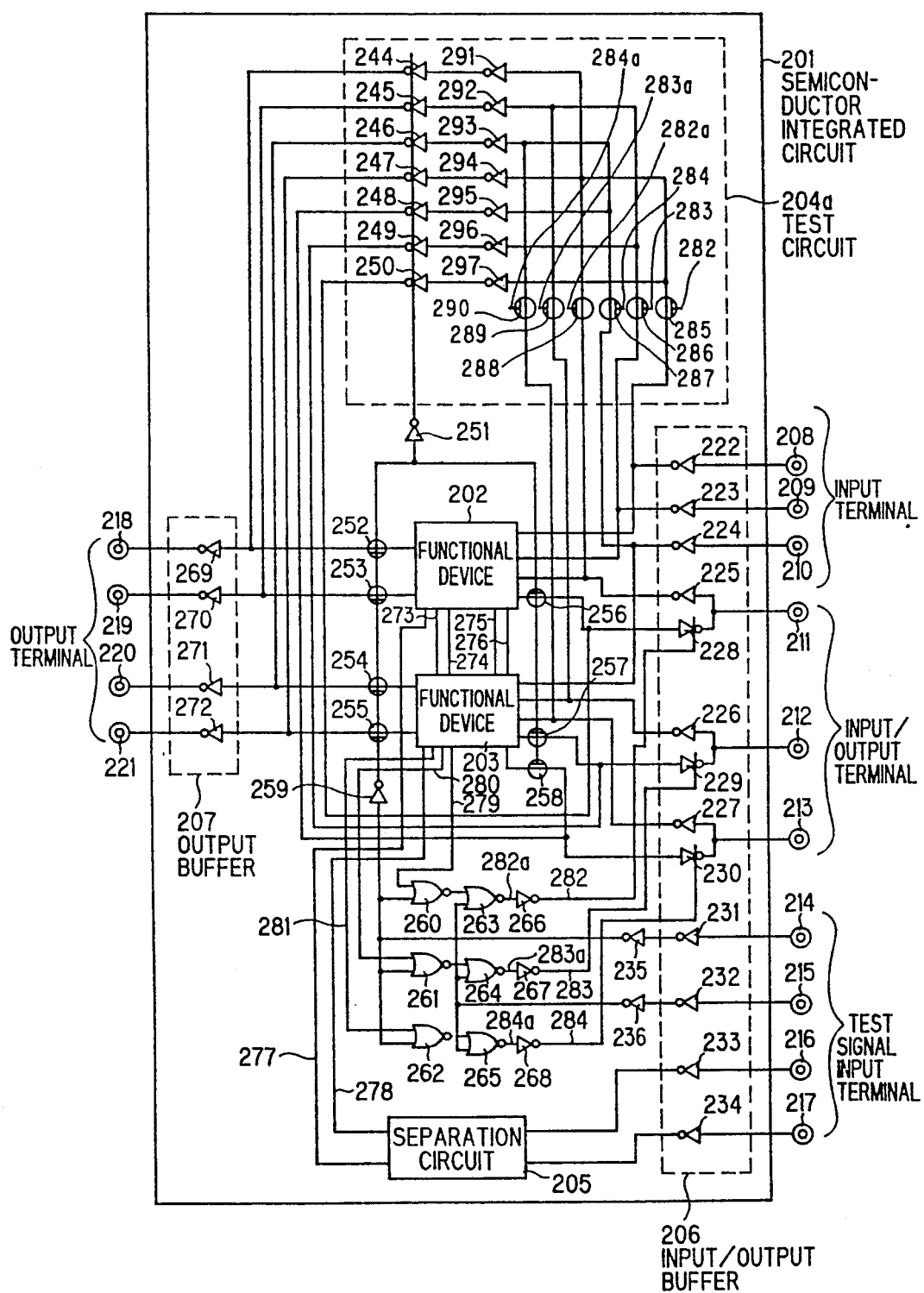
FIG. 6 is a circuit diagram showing a semiconductor circuit of a third preferred embodiment according to the invention.

FIG. 6 shows a semiconductor integrated circuit of a third preferred embodiment according to the invention. In this embodiment, explanation of the same structure and operation as the second preferred embodiment shown in FIG. 4 are omitted. A different between this embodiment and the second preferred embodiment is a structure of the test circuit 204 (FIG. 4) and 204a. That is, the test circuit 204a includes transfer gates 285 to 290 and inverters 291 to 297 in place of the NAND gates 237 to 243.

The ON/OFF of the transfer gates 285 to 287 and 288 to 290 are controlled by the change signals 282 to 284 and 282a to 284a, respectively. The transfer gates 285 to 287 are controlled by the input/output changing signals 282 to 284, while the transfer gates 288 to 290 are controlled by the input/output changing signals 282a to 284a. Accordingly, when the input/output terminals 211 to 213 are used as input terminals, the transfer gates 285 to 287 are OFF, while the transfer gates 288 to 290 are ON. On the other hand, when the input/output terminals 211 to 213 are used as output terminals, the transfer gates 285 to 287 are ON, while the transfer gates 288 to 290 are OFF.

FIG. 7 shows a truth table of test patterns used in this embodiment. In this figure, " " indicates that the input/output terminals 211 to 213 are under an input state, and " " indicates that a signal of any level may be applied to the input terminals 208 to 210.

Although the invention has been described with respect to specific embodiment for complete and clear disclosure, the appended claims are not to be thus limited but are to be construed as embodying all modification and alternative constructions that may occur to one skilled in the art which fairly fall within the basic teaching herein set forth.

What is claimed is:

1. A semiconductor integrated circuit comprising:
a plurality of functional devices connected to each other to carry out a predetermined operation;
an input buffer circuit connected to input terminals to supply input signals therefrom to said functional devices;
an output buffer circuit connected to output terminals to supply output signals from said functional devices to said output terminals;
first means for separating connections of said functional devices when a characteristic test of said input and output buffer circuits is carried out;
second means for separating a connection selected from a first connection between said input buffer circuit and said functional devices and a second connection between said functional devices and said output buffer circuit when said characteristic test is carried out; and
means for connecting said input and output buffer circuits when said second means separates said connection, said connecting means connecting said input and output terminals via said input and output buffer circuits when said characteristic test is carried out, and including a logic circuit operating to provide signal paths via said input and output buffer circuits from said input terminals to corresponding terminals of said output terminals so that characteristics of both said input and output buffer circuits are detected through said signal paths.

2. A semiconductor integrated circuit comprising;
a plurality of input terminals each applied with input signals;
a plurality of output terminals each providing output signals;
a plurality of functional devices having predetermined functions, respectively;
an input buffer circuit connected between said input terminals and said plurality of functional devices;
an output buffer circuit connected between said plurality of functional devices and said output terminals;
means for separating said functional devices and said output buffer circuit when characteristics of said input buffer circuit and said output buffer circuit are tested; and means for connecting said input buffer circuit and said output buffer circuit when said characteristics of said input buffer circuit and said output buffer circuit are tested, said connecting means connecting said input and output terminals via said input and output buffer circuits when said characteristic test is carried out, and including a logic circuit operating to provide signal paths vis said input and output buffer circuits from said input terminals to corresponding terminals of said output terminals so that characteristics of both said input and output buffer circuits are detected through said signal paths.

3. A semiconductor integrated circuit, according to claim 2, wherein:

said separating means comprises a first gate set which is connected between said functional devices and said output terminals, and becomes ON state when said semiconductor integrated circuit normally operates and becomes OFF state, when said characteristics of said input buffer circuit and said output buffer circuit are tested.

4. A semiconductor integrated circuit, according to claim 3, wherein:

said connecting means further comprises a second gate set which is connected between said input buffer circuit and said output buffer circuit, and becomes OFF state, when said semiconductor integrated circuit normally operates, and becomes ON state, when said characteristics of said input buffer circuit and said output buffer circuit are tested.

5. A semiconductor integrated circuit, according to claim 4, wherein:

said input terminals comprise a test signal terminal applied with test signals to change said first gate set to OFF state and said second gate set to ON state, when said characteristics of said input buffer circuit and said output buffer circuit are tested.

6. A semiconductor integrated circuit according to claim 1, wherein said logic circuit is an inverter circuit.

7. A semiconductor integrated circuit according to claim 2, wherein said logic circuit includes an inverter.

* * * * *